United States Patent
Nakamura et al.

(10) Patent No.: US 12,064,817 B2
(45) Date of Patent: Aug. 20, 2024

(54) SURFACE-COATED CUTTING TOOL

(71) Applicant: MITSUBISHI MATERIALS CORPORATION, Tokyo (JP)

(72) Inventors: Eiji Nakamura, Tokyo (JP); Mitsuhiro Abe, Tokyo (JP); Kazuhiro Kawano, Tokyo (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 154 days.

(21) Appl. No.: 17/913,547

(22) PCT Filed: Jun. 5, 2020

(86) PCT No.: PCT/JP2020/022400
§ 371 (c)(1),
(2) Date: Sep. 22, 2022

(87) PCT Pub. No.: WO2021/192327
PCT Pub. Date: Sep. 30, 2021

(65) Prior Publication Data
US 2023/0105932 A1    Apr. 6, 2023

(30) Foreign Application Priority Data

Mar. 25, 2020   (JP) ................................. 2020-053655

(51) Int. Cl.
*B23B 27/14*   (2006.01)
*C23C 16/02*   (2006.01)
(Continued)

(52) U.S. Cl.
CPC ........ *B23B 27/148* (2013.01); *C23C 16/0272* (2013.01); *C23C 16/308* (2013.01);
(Continued)

(58) Field of Classification Search
CPC . B23B 27/148; C23C 16/0272; C23C 16/308; C23C 16/36; C23C 16/403; C23C 16/405
See application file for complete search history.

(56) References Cited

U.S. PATENT DOCUMENTS

| 2007/0218313 | A1  | 9/2007 | Okada et al. |
| 2010/0129626 | A1* | 5/2010 | Langhorn ............... C23C 28/44 |
| | | | 427/419.7 |

(Continued)

FOREIGN PATENT DOCUMENTS

| EP | 3366796 A1 | 8/2018 |
| EP | 3034653 B1 | 4/2019 |

(Continued)

OTHER PUBLICATIONS

[NPL-1] Imamura et al. (WO 2019/176202 A1), Sep. 19, 2019 (EPO machine translatin to English). (Year: 2019).*

(Continued)

*Primary Examiner* — David Sample
*Assistant Examiner* — Donald M Flores, Jr.
(74) *Attorney, Agent, or Firm* — Locke Lord LLP

(57) ABSTRACT

A surface coated cutting tool includes a tool substrate; and a hard coating layer on the tool substrate. The hard coating layer includes, in sequence from the tool substrate toward a surface of the tool, a titanium carbonitride inner layer, a titanium nitride lower intermediate layer, a titanium carbonitride upper intermediate layer, a titanium oxycarbonitride bonding auxiliary layer, and an aluminum oxide outer layer. Titanium nitride grain boundaries in the lower intermediate layer and titanium carbonitride grain boundaries in the upper intermediate layer are continuous from titanium carbonitride grain boundaries in the inner layer. The texture coefficient TC(422) of titanium carbonitride in the inner layer and the upper intermediate layer is 3.0 or more, and the texture (Continued)

coefficient TC(0 0 12) of α-aluminum oxide in the outer layer is 5.0 or more.

1 Claim, 1 Drawing Sheet

(51) Int. Cl.
    *C23C 16/30*     (2006.01)
    *C23C 16/36*     (2006.01)
    *C23C 16/40*     (2006.01)

(52) U.S. Cl.
    CPC ............ *C23C 16/36* (2013.01); *C23C 16/403* (2013.01); *C23C 16/405* (2013.01)

(56) References Cited

U.S. PATENT DOCUMENTS

2016/0175940 A1*   6/2016   Lindahl ................. C23C 28/048
                                                                                                                                                                                                          428/141

2017/0209936 A1*   7/2017   Kanaoka ........... C23C 16/45523
2019/0111497 A1     4/2019   Stiens et al.

FOREIGN PATENT DOCUMENTS

| | | |
|---|---|---|
| JP | 2005-297141 A | 10/2005 |
| JP | 5872746 B1 | 3/2016 |
| JP | 2016-137564 A | 8/2016 |
| JP | 2019-511378 A | 4/2019 |
| JP | 2019-171546 A | 10/2019 |
| WO | 2017220536 A1 | 12/2017 |
| WO | 2018/158245 A1 | 9/2018 |
| WO | 2018/234296 A1 | 12/2018 |
| WO | 2019/176202 A1 | 9/2019 |
| WO | WO-2019176202 A1 * | 9/2019 ........... B23B 27/148 |

OTHER PUBLICATIONS

Supplementary European Search Report dated Mar. 21, 2024, issued for EP20927962.9.

* cited by examiner

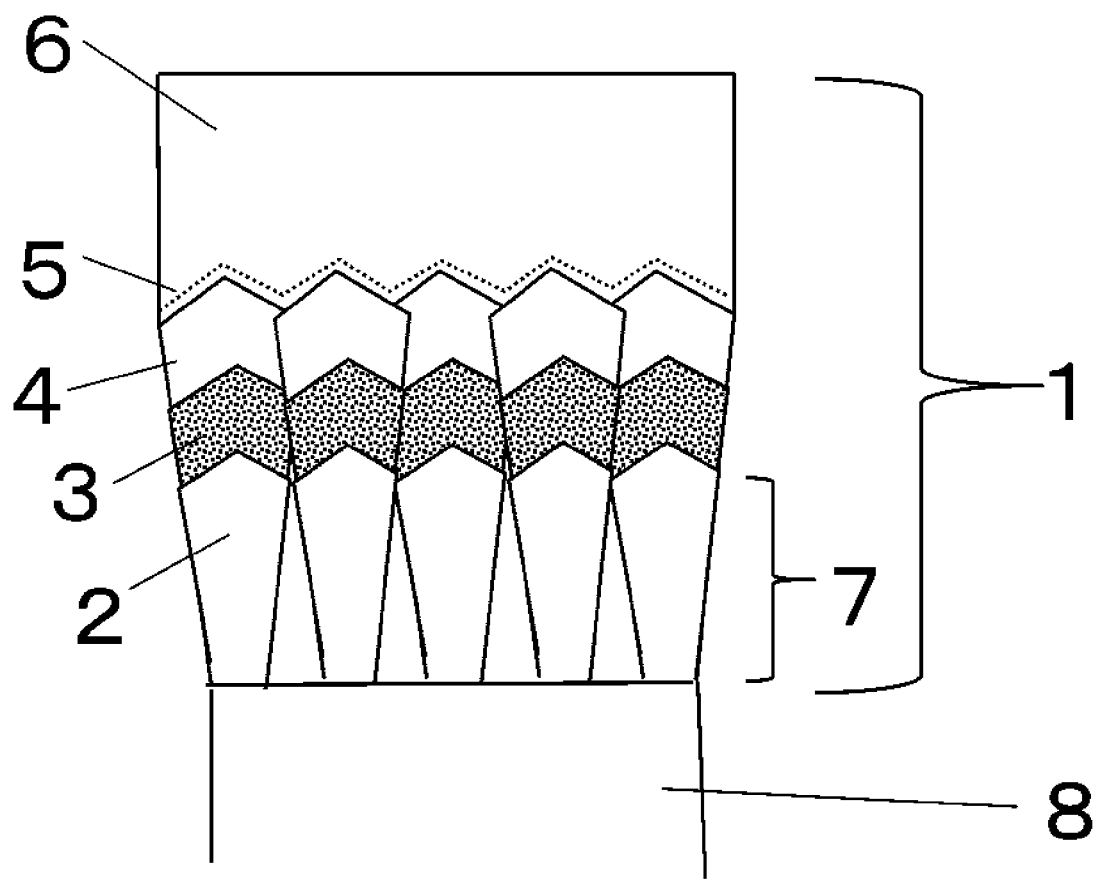

SURFACE-COATED CUTTING TOOL

TECHNICAL FIELD

The present invention relates to surface coated cutting tools (hereinafter referred to as coated tools). This patent application claims the benefits of Japanese Patent Application No. 2020-053655, filed on Mar. 25, 2020, the entire contents of which are hereby expressly incorporated by reference.

BACKGROUND ART

Coated tools are known for the purpose of improving the cutting performance of cutting tools. In such coated tools, a hard coating layer is formed by vapor deposition on the surface of a tool substrate made of tungsten carbide (hereinafter denoted by WC) based cemented carbide. The resulting cutting tools exhibit high wear resistance.

Although such conventional coated tools with hard coating layers have high wear resistance, various proposals have been made to further improve the cutting performance of the hard coating layers.

For example, PTL 1 discloses a coated tool having a hard coating layer. The coated tool includes a TiCN layer, a bonding layer, and an $\alpha$-$Al_2O_3$ layer deposited, in sequence, on the surface of a tool substrate, where the TiCN layer has an average thickness in the range of 4 to 20 μm, the texture coefficient TC(220) (hereinafter referred to as merely TC) is 0.5 or less, TC(422) is 3 or more, the sum of TC(311) and TC(422) is 4 or more, the bonding layer comprises at least one of the TiN, TiCN, TiCO, and TiCNO layers and has an average thickness of 0.5 to 2 μm, the $\alpha$-$Al_2O_3$ layer has an average thickness of 2 to 20 μm, TC(0 0 12) is 7.2 or more, and I(0 0 12)/I(0 0 14) is 1 or more.

PTL 2 also discloses a coated tool having a hard coating layer. The coated tool includes a TiCN layer, a bonding layer, and an $\alpha$-$Al_2O_3$ layer disposed, in sequence, on the surface of a tool substrate, where the TiCN layer has an average thickness in the range of 2 to 20 μm, the bonding layer comprises TiCNO or TiBN with an acicular structure, the $\alpha$-$Al_2O_3$ layer has an average thickness of 1 to 15 μm, and TC(006) exceeds 5.

CITATION LIST

Patent Literature

PTL 1: Japanese Unexamined Patent Application Publication No. 2016-137564
PTL 2: Japanese Patent No. 5872746

SUMMARY OF INVENTION

Technical Problem

Recent demand is strong for labor and energy savings in cutting operations, and accelerates trends of the cutting operations toward higher speeds and greater efficiency; hence, requirements for the hard coating layer of coated tools include high resistance against abnormal damage, for example, chipping, fracture, and peeling, in addition to high wear resistance over long-term use.

Unfortunately, according to the examination by the present inventors, the coated tools described in PTLs 1 and 2 are not sufficiently durable in cutting operations under high load against the cutting edge.

An object of the present invention, in view of such a circumstance, is to provide a coated tool with sufficient durability in cutting operations under high load against the cutting edges.

Solution to Problem

A surface coated cutting tool according to an embodiment of the present invention includes:
a tool substrate; and
a hard coating layer on the tool substrate; the hard coating layer comprising, in sequence from the tool substrate toward a surface of the tool,
   an inner layer, a lower intermediate layer, an upper intermediate layer, a bonding auxiliary layer, and outer layer, wherein
the inner layer comprises titanium carbonitride and has an average thickness in the range of 4.0 to 20.0 μm,
the lower intermediate layer comprises titanium nitride and has an average thickness in the range of 0.1 to 2.0 μm,
the upper intermediate layer comprises titanium carbonitride and has an average thickness in the range of 0.1 to 2.5 μm,
titanium nitride grain boundaries in the lower intermediate layer and titanium carbonitride grain boundaries in the upper intermediate layer are continuous from titanium carbonitride grain boundaries in the inner layer,
the bonding auxiliary layer comprises titanium oxycarbonitride and has an average thickness in the range of 3 to 80 nm,
the outer layer comprises $\alpha$-aluminum oxide and has an average thickness in the range of 2.0 to 20.0 μm,
the texture coefficient TC(422) of titanium carbonitride in the inner layer and the upper intermediate layer is 3.0 or more, and the texture coefficient TC(0 0 12) of $\alpha$-aluminum oxide in the outer layer is 5.0 or more.

Advantageous Effects of Invention

The cutting tool has sufficiently high durability in cutting operations under high load against the cutting edge.

BRIEF DESCRIPTION OF DRAWINGS

FIG. 1 is a schematic diagram illustrating an inner layer, a lower intermediate layer, an upper intermediate layer, a bonding auxiliary layer, and an outer layer of a coated tool according to an embodiment of the present invention.

DESCRIPTION OF EMBODIMENTS

The present inventors have studied to improve the durability of coated tools including a hard coating layer composed of $\alpha$-aluminum oxide, focusing on the $\alpha$-aluminum oxide layer and the bonding auxiliary layer (the bonding layer), and have found that the acicular structure of the bonding layer adversely affects the durability of the tool.

In detail, the bonding layer described in PTL 1 has an acicular structure, similar to the bonding layer in PTL 2, to achieve an anchor effect to strengthen the bond with the $\alpha$-aluminum oxide layer, although this is not specified in PTL1.

The inventors have found through investigation that this acicular structure causes voids to form in the interface region between the $\alpha$-aluminum oxide layer and the bonding layer. In detail, raw material gas to form the $\alpha$-aluminum oxide layer does not sufficiently reaches the gaps in the acicular structure, resulting in the generation of voids. The voids inhibit the anchor effect of the acicular structure. The inventors have also found that the chipping resistance can be improved by modifying the Ti carbonitride layer described in PTLs 1 and 2 to a triple layer configuration that includes a titanium carbonitride layer, a titanium nitride layer, and a titanium carbonitride layer.

One embodiment of the present invention will now be described in detail. Throughout the specification and the claims, when a numerical value range is expressed as "A to B" (A and B are both numerical values), the range includes the upper limit (B) and the lower limit (A), and the upper limit (B) and lower limit (A) have the same unit. These values include errors of measurement.

The compositions of the titanium nitride, titanium carbonitride, titanium oxycarbonitride, titanium oxide, and α-aluminum oxide layers are not limited to their stoichiometric compositions, and includes all the known compositions having various atomic ratios.

As shown schematically in FIG. 1, a coated tool according to one embodiment of the invention includes an inner layer (2), a lower intermediate layer (3), an upper intermediate layer (4), a bonding auxiliary layer (5), and an outer layer (6) in a hard coating layer (1) on a tool substrate (8). The inner layer (2), the lower intermediate layer (3), the upper intermediate layer (4), and the bonding auxiliary layer (5) (hereinafter collectively referred to as a major layer) are formed by epitaxial growth under control of the composition and reaction atmosphere pressure of the deposition gas. When observed in a longitudinal section (cross section perpendicular to the surface of the tool substrate (8)), the grain boundaries of titanium nitride in the lower intermediate layer (3) and titanium carbonitride in the upper intermediate layer (4) are continuous from the grain boundaries of titanium carbonitride constituting columnar grains (7) in the inner layer (2). When they are viewed as a whole, the structure can be seen as if they were a part of one large columnar grain. In addition, the bonding auxiliary layer (5) does not have an acicular structure, in other words, the bonding auxiliary layer (5) has a non-acicular structure that includes equiaxed crystals.

Continuous grain boundaries indicate that the grain boundaries can be seen as continuous when any longitudinal section of the hard coating layer is observed with a scanning electron microscope (SEM), as described below. The reason why the grain boundaries appear to be continuous is that the lattice constants of the epitaxially grown titanium nitride and titanium carbonitride can be regarded as virtually identical; hence, titanium nitride in the lower middle layer grows in the same lattice spacing (plane spacing) as titanium nitride in the inner layer and titanium carbonitride in the upper middle layer grows in the same lattice spacing (plane spacing) as titanium nitride in the lower middle layer, respectively, in the direction parallel to the surface of the tool substrate, and this lattice spacing is maintained even after cooling after deposition of the film. The face spacing of titanium carbonitride in the inner layer is inherited by titanium nitride in the lower middle layer and titanium carbonitride in the upper middle layer.

Individual layers will now be described in detail.

Inner Layer:

The inner layer comprises titanium carbonitride containing columnar particles adjacent to the tool substrate or an innermost layer to be described below. The inner layer preferably has an average thickness of 4.0 to 20.0 µm. A thickness of less than 4.0 µm leads to lower wear resistance, whereas a thickness of more than 20.0 µm leads to lower fracture resistance. The average thickness is more preferably 5.0 to 15.0 µm, even more preferably 8.0 to 12.0 µm.

Lower Intermediate Layer:

The lower intermediate layer is disposed between the inner layer and the upper intermediate layer and is preferably a titanium nitride layer having an average thickness of 0.1 to 2.0 µm. The titanium nitride layer, which is soft and has low Young's modulus compared to the other major layers, enhances the toughness and improves the chipping resistance of the hard coating layer. Although tight adhesion between the titanium oxycarbonitride layer, which is the bonding auxiliary layer, and the α-aluminum oxide layer, which is the outer layer, generates large distortion in the upper intermediate layer adjacent to the bonding auxiliary layer due to a difference in thermal expansion coefficient and other physical properties between these materials, such distortion can be relaxed by the titanium nitride layer having a low Young's modulus. An average thickness of the lower intermediate layer exceeding 2.0 µm impairs the aforementioned continuity of the grain boundaries; hence, the average thickness of the lower intermediate layer should be preferably 0.1 to 2.0 µm, more preferably 0.3 to 1.5 µm, most preferably 0.5 to 1.0 µm.

The lower intermediate layer also contributes to tight bonding between the upper intermediate layer and the inner layer.

Upper Intermediate Layer:

The upper intermediate layer comprises titanium carbonitride and is disposed between the lower intermediate layer and the bonding auxiliary layer. The reason why titanium carbonitride layer is used is that the bonding auxiliary layer described below, which comprises titanium oxycarbonitride containing oxygen, has high chemical affinity with α-aluminum oxide of the outer layer, and high crystallographic affinity due to the inclination of the (422) plane of titanium carbonitride and the (0 0 12) plane of α-aluminum oxide. An average thickness less than 0.1 µm of the upper intermediate layer leads to insufficient affinity characteristics. An average thickness more than 2.5 µm precludes an improvement in toughness of the hard coating layer by the lower intermediate layer. The average thickness of the upper intermediate layer ranges from preferably 0.3 to 2.0 µm, more preferably 0.5 to 1.5 µm.

Texture Coefficient TC(422) of Titanium Carbonitride of Inner Layer and Upper Intermediate Layer As mentioned above, the inner layer, lower intermediate layer, and upper intermediate layer collectively can be regarded as a large mass of columnar grains in the major layers. The texture coefficient TC(422) of titanium carbonitride, which constitutes a major phase of these layers, should preferably be 3.0 or higher. A texture coefficient TC(422) of 3.0 or higher causes the texture coefficient TC(0 0 12) of α-aluminum oxide of the outer layer deposited by epitaxial growth to be 5.0 or more, resulting in an improvement in wear resistance. The texture coefficient TC is measured by X-ray diffractometry in the concentration method optical system of 2θ/θ focused optics using CuKα and is defined by the following Harris formula:

$$TC(hkl) = \frac{I(hkl)}{I_0(hkl)} \left[ \frac{1}{n} \sum_{k=1}^{n} \frac{I(hkl)}{I_0(hkl)} \right]^{-1} \quad \text{Formula 1}$$

In the formula, I(hkl) is the diffraction intensity of the (hkl) plane, $I_0$(hkl) is the standard intensity listed in ICDD file number 00-042-1489, and n is the total number of reflecting planes. The reflecting planes to be considered are (111), (200), (220), (311), (331), (420), (422), and (511) planes.

Bonding Auxiliary Layer:

The bonding auxiliary layer is in contact with the outer layer, i.e., the α-aluminum oxide layer and corresponds to the bonding layer described in PTLs 1 and 2. The bonding auxiliary layer comprises titanium oxycarbonitride having an average thickness of 3 to 80 nm. This layer with an average thickness of 3 to 80 nm, which contains oxygen, exhibits strong adhesion with the α-aluminum oxide layer being the outer layer. The average thickness is more preferably in the range of 3 to 50 nm, most preferably in the range of 3~30 nm for stronger adhesion.

The bonding auxiliary layer is a thin layer with an average thickness of 3 to 80 nm, which is achieved by controlling the composition of the deposition gas and the reaction time, and does not have an acicular structure. As a results, the outer layer, i.e., α-aluminum oxide layer can be formed to be tightly bonded to the inner layer, the lower intermediate layer, and the upper intermediate layer with the bonding auxiliary layer therebetween, without formation of voids in the vicinity of the bonding auxiliary layer.

Outer Layer:

The outer layer should preferably comprise α-aluminum oxide and has an average thickness of 2.0 to 20.0 μm and a texture coefficient TC(0 0 12) of 5.0 or more. An average thickness less than 2.0 μm, which is too thin, cannot ensure sufficient durability over a long period of use. An average thickness exceeding 20.0 μm leads to coarsening of crystal grains of the α-aluminum oxide layer, resulting in chipping. A TC(0 0 12) of 5.0 or more leads to higher wear resistance.

The TC (0 0 12) is determined using the standard intensities of the (104), (110), (113), (024), (116), (214), (300), and (0 0 12) planes listed in ICDD file number 00-010-0173.

Other Layers:

In some embodiments, an innermost layer with an average total thickness of 0.1 μm to 2.0 μm may be disposed between the tool substrate and the inner layer. The innermost layer includes at least one titanium carbide and/or titanium nitride sublayer. The innermost layer enhances the durability of the coated tool. A total thickness less than 0.1 μm of the innermost layer leads to insufficient enhancement in durability. A total thickness exceeding 2.0 μm leads to coarsening of crystal grains, resulting in ready chipping.

In some embodiments, an outermost layer with an average total thickness of 0.1 to 4.0 μm may be provided on the outer layer. The outermost layer includes at least one titanium nitride, carbide, and/or carbonitride sublayer. The outermost layer has a distinct color. In the case that the coating tool is an insert, the corner (used parts) can be readily identified after cutting use. An average total thickness less than 0.1 μm does not demonstrate the function of the outermost layer. An average total thickness exceeding 4.0 μm leads to ready chipping.

Tool Substrate:

In this embodiment, the tool substrate comprises, but not limited to, WC cemented carbide (WC-based cemented carbide) containing cobalt, and carbonitride of titanium, tantalum, and niobium; cermets primarily composed of TiC, TiN, and TiCN; ceramics such as silicon nitride, sialon, and aluminum oxide; or cBN sintered body.

Determination of Average Thickness:

The average thickness of each layer in the hard coating layer is determined as follows: A cross-sectional specimen perpendicular to any point of the hard coating layer was prepared with a focused ion beam (FIB) system and a cross-section polisher (CP), and the thicknesses at several points (for example, five points) on the cross section were observed and averaged with a scanning electron microscope (SEM), a transmission electron microscope (TEM), a scanning transmission electron microscope (STEM), or an energy dispersive X-ray spectrometer (EDX) provided with a SEM or TEM.

EXAMPLES

Examples of the present invention will now be described.

In examples, tool substrates are applied to insert cutting tools comprising WC-based cemented carbide, but the same applies even if the aforementioned tool substrate is used, or if it is applied to drills or end mills.

Raw powders with an average particle size of 1 to 3 μm of WC, TiC, TiN, NbC, $Cr_3C_2$, and Co were prepared and formulated into compositions shown in Table 1. Wax was added to each composition and the mixture was mixed with acetone for 24 hours in a ball mill followed by drying under reduced pressure. The mixture was compacted under a pressure of 98 MPa into a green compact with a predetermined shape. The green compact was sintered under a vacuum of 5 Pa for one hour at a predetermined temperature within a range of 1370° C. to 1470° C. into tool substrates A and B made of WC-based cemented carbide and having an insert shape of ISO standard CNMG120412.

Primary layers were deposited on the surface of the tool substrate A or B. The inner and outer layers were deposited according to the conditions shown in Table 2. A lower intermediate layer, an upper intermediate layer, and a bonding auxiliary layer were deposited according to the conditions shown in Table 3, followed by oxidation treatment as shown in the same table to produce Inventive Coating Tools 1 to 6 shown in Table 6. The innermost layer and/or outermost layer (titanium nitride layer) was deposited according to the conditions shown in Table 4, except for Example Tools 1 and 4.

Comparative Example Tools 1 to 6 shown in Table 6 were prepared by depositing hard coating layers on the surfaces of tool substrates A and B in accordance with the conditions described in PTL 1 as shown in Table 2, 3 or 5. The comparative coated tools have no lower intermediate layer or an average thickness of the lower intermediate layer not satisfying the range specified in one embodiment of the present invention, regardless of deposition under conditions for the inventive coated tool; have no upper intermediate layer or an average thickness of the upper intermediate layer not satisfying the range specified in one embodiment of the invention; or have an average thickness of the bonding auxiliary layer not satisfying the range specified in one embodiment of the invention. The results of SEM observation (magnification 500 to 5000×) showed that the TiCNO layers corresponding to the bonding auxiliary layer of one embodiment of the present invention all had acicular structures. In Examples and Comparative Examples, other than Comparative Example Tools 1 and 4, the innermost layer and/or the outermost layer (titanium nitride layer) were deposited under the conditions shown in Table 4.

TABLE 1

| Type | | Co | TiC | TiN | NbC | $Cr_3C_2$ | WC |
|---|---|---|---|---|---|---|---|
| Tool substrate | A | 5.8 | — | — | — | — | Balance |
| | B | 7.0 | 1.5 | 1.5 | 3.0 | 0.1 | Balance |

*"—" indicates non-containing.

TABLE 2

| Layer Type | Composition | Composition of reactive gas (volume %) | Reaction atmosphere Pressure (hPa) | Temp. (° C.) |
|---|---|---|---|---|
| Inner | TiCN | $TiCl_4$: 2%, $CH_3CN$: 0.6%, $N_2$: 20%, $H_2$: Balance | 67 | 910 |
| Outer | $Al_2O_3$ | $AlCl_3$: 3%, $CO_2$: 6%, $H_2S$: 0.5%, HCl: 1.5%, $H_2$: Balance | 67 | 1000 |

TABLE 3

| | Layer Type | Composition | Composition of reactive gas (volume %) | Pressure (hPa) | Temp. (° C.) |
|---|---|---|---|---|---|
| Depositing condition A | Lower intermediate | TiN | α: $TiCl_4$: 0.5%, $N_2$: 15%, $H_2$: Balance | 267 | 905 |
| | | | β: $TiCl_4$: 1%, $N_2$: 15%, $H_2$: Balance | 267 | 905 |
| | Upper intermediate | TiCN | α: $TiCl_4$: 0.5%, $CH_3CN$: 0.15%, $N_2$: 20%, $H_2$: Balance | 60 | 905 |
| | | | β: $TiCl_4$: 1%, $CH_3CN$: 0.3%, $N_2$: 20%, $H_2$: Balance | 60 | 905 |
| | Bonding auxiliary | TiCNO | α: $TiCl_4$: 1%, $CH_3CN$: 0.3%, $N_2$: 15%, CO: 0.04%, $H_2$: Balance | 60 | 905 |
| | | | β: $TiCl_4$: 1%, $CH_3CN$: 0.3%, $N_2$: 15%, CO: 0.16%, $H_2$: Balance | 60 | 905 |
| | Oxidation | — | (Time 20 min) $CO_2$: 2.0%, CO: 2.0%, $H_2$: Balance | 60 | 905 |
| Depositing condition B | Lower intermediate | TiN | α: $TiCl_4$: 0.5%, $N_2$: 15%, $H_2$: Balance | 267 | 895 |
| | | | β: $TiCl_4$: 1%, $N_2$: 15%, $H_2$: Balance | 267 | 895 |
| | Upper intermediate | TiCN | α: $TiCl_4$: 0.5%, $CH_3CN$: 0.15%, $N_2$: 20%, $H_2$: Balance | 60 | 895 |
| | | | β: $TiCl_4$: 1%, $CH_3CN$: 0.3%, $N_2$: 20%, $H_2$: Balance | 60 | 895 |
| | Bonding auxiliary | TiCNO | α: $TiCl_4$: 1%, $CH_3CN$: 0.3%, $N_2$: 15%, CO: 0.04%, $H_2$: Balance | 60 | 895 |
| | | | β: $TiCl_4$: 1%, $CH_3CN$: 0.3%, $N_2$: 15%, CO: 0.16%, $H_2$: Balance | 60 | 895 |
| | Oxidation | — | (Time 30 min) $CO_2$: 2.0%, CO: 2.0%, $H_2$: Balance | 60 | 895 |
| Depositing condition C | Lower intermediate | TiN | α: $TiCl_4$: 0.5%, $N_2$: 15%, $H_2$: Balance | 133 | 905 |
| | | | β: $TiCl_4$: 1%, $N_2$: 15%, $H_2$: Balance | 267 | 905 |
| | Upper intermediate | TiCN | α: $TiCl_4$: 0.5%, $CH_3CN$: 0.15%, $N_2$: 20%, $H_2$: Balance | 53 | 905 |
| | | | β: $TiCl_4$: 1%, $CH_3CN$: 0.3%, $N_2$: 20%, $H_2$: Balance | 60 | 905 |
| | Bonding auxiliary | TiCNO | α: $TiCl_4$: 1%, $CH_3CN$: 0.3%, $N_2$: 15%, CO: 0.04%, $H_2$: Balance | 53 | 905 |
| | | | β: $TiCl_4$: 1%, $CH_3CN$: 0.3%, $N_2$: 15%, CO: 0.16%, $H_2$: Balance | 60 | 905 |
| | Oxidation | — | (Time 20 min) $CO_2$: 2.0%, CO: 2.0%, $H_2$: Balance | 60 | 905 |

α: Up to 10 minutes from the start of deposition
β: From 10 minutes after the start of deposition

TABLE 4

| Layer Type | Comp. | Composition of reactive gas (volume %) | Pressure (hPa) | Temp. (° C.) |
|---|---|---|---|---|
| Innermost | TiN | $TiCl_4$: 2%, $N_2$: 25%, $H_2$: Balance | 67 | 920 |
| Outermost | TiN | $TiCl_4$: 2%, $N_2$: 30%, $H_2$: Balance | 267 | 1000 |

TABLE 5

| | | | Parameters for deposition in each layer | | |
|---|---|---|---|---|---|
| | | | | Reaction atmosphere | |
| Layer type | | Comp. | Composition of reactive gas (volume %) | Pressure (hPa) | Temp. (° C.) |
| Depositing condition a | Upper intermediate | TiCN | TiCl$_4$: 2%, CH$_3$CN: 0.6%, N$_2$: 20%, H$_2$: Balance | 67 | 910 |
| | Bonding auxiliary | TiCNO | TiCl$_4$: 4.2%, CO: 4%, CH$_4$: 3%, N$_2$: 20%, H$_2$: Balance | 200 | 1000 |
| | Oxidation | — | (Time 5 min) CO$_2$: 2.0%, CO: 2.0%, H$_2$: Balance | 60 | 1000 |

TABLE 6

| Type | | Tool substrate | Conditions for deposition of lower intermediate layer, upper intermediate layer, bonding auxiliary layer | Average thickness of innermost layer (μm) | Average thickness of inner layer (μm) | Average thickness of lower intermediate layer (μm) | Average thickness of upper intermediate layer (μm) | TC (422) | Average thickness of binding auxiliary layer (nm) | Average thickness (μm) | TC (0012) | Average thickness of outermost layer (μm) Titanium nitride (TiN) layer |
|---|---|---|---|---|---|---|---|---|---|---|---|---|
| Example Tool | 1 | A | A | — | 6.0 | 0.3 | 1.0 | 4.1 | 30 | 15.0 | 7.3 | — |
| | 2 | A | B | 0.5 | 4.0 | 0.5 | 1.6 | 3.0 | 15 | 20.0 | 7.7 | — |
| | 3 | A | C | — | 8.0 | 0.7 | 1.2 | 4.4 | 3 | 12.0 | 7.1 | 1.0 |
| | 4 | B | A | — | 20.0 | 0.1 | 0.3 | 6.9 | 30 | 2.0 | 5.0 | — |
| | 5 | B | B | 0.7 | 18.0 | 1.7 | 0.1 | 6.5 | 15 | 4.0 | 5.5 | — |
| | 6 | B | C | — | 12.0 | 0.9 | 2.5 | 5.8 | 3 | 10.0 | 6.9 | 1.5 |
| Comparative Example Tool | 1 | A | a | — | 6.0 | | 1.0 | 4.0 | 1500 | 15.0 | 7.2 | — |
| | 2 | A | a | 0.5 | 4.0 | | 1.6 | 3.2 | 1000 | 20.0 | 7.7 | — |
| | 3 | A | a | — | 8.0 | | 1.2 | 4.4 | 800 | 12.0 | 7.0 | 1.0 |
| | 4 | B | a | — | 20.0 | | 0.3 | 6.8 | 1500 | 2.0 | 5.0 | — |
| | 5 | B | a | 0.7 | 18.0 | | 0.1 | 6.4 | 1000 | 4.0 | 5.5 | — |
| | 6 | B | a | — | 12.0 | | 2.5 | 5.7 | 800 | 10.0 | 6.4 | 1.5 |

*"—" indicates non-containing.

Example Tools 1 to 6 and Comparative Example Tools 1 to 6 were each clamped to the tip of a turning tool made of tool steel with a fixture and then subjected to cutting tests 1 and 2 on a dry lathe of ductile cast and alloy steel to evaluate cutting performance. The conditions for cutting tests are as follows:

Cutting Test 1
  Samples: Example Tools 1 to 3 and Comparative Example Tools 1 to 3
  Workpiece material: FCD700
  Cutting speed: 400 m/min
  Feed per revolution: 0.3 mm/rev
  Cutting depth: 1.5 mm
  Cutting time: 1 min (one pass)
  Evaluation: The cutting edge was observed with a magnifying glass at 2× magnification every minute, and the time was measured until the peeling of the α-aluminum oxide layer was confirmed. The results are shown in Table 7.

Cutting Test 2
  Samples: Example Tools 4 to 6 and Comparative Example Tools 4 to 6
  Workpiece material: SNCM439
  Cutting speed: 200 m/min
  Feed per revolution: 0.55 mm/rev
  Cutting depth: 4 mm
  Cutting time: 2 min
  Evaluation: Each used corner was observed after two minutes from the start of cutting. Five corners of each tool were evaluated and the number of corners having chipping was counted. The results are shown in Table 8.

TABLE 7

| Type | | Time until the α-aluminum oxide layer peels off (min) |
|---|---|---|
| Example Tool | 1 | 7 |
| | 2 | 8 |
| | 3 | 10 |
| Comparative Example tool | 1 | 1 |
| | 2 | 1 |
| | 3 | 1 |

TABLE 8

| Type | | Number of corners where chipping occurred |
|---|---|---|
| Example Tool | 4 | 1 |
| | 5 | 1 |
| | 6 | 0 |
| Comparative Example tool | 4 | 5 |
| | 5 | 5 |
| | 6 | 5 |

The results shown in Tables 7 and 8 demonstrate that the Example Tools show satisfactory cutting performance even when it is used for cutting ductile cast iron and alloy steel, which subject the cutting edges to large load during cutting operations whereas the Comparative Example Tools show peeling of the α-aluminum oxide ($Al_2O_3$) layer within a short period of time or many chippings, leading to a short life time.

The disclosed embodiments are in all respects illustrative only and are not restrictive; the scope of the invention is indicated by the claims, not the embodiments, and is intended to include all variations within the gist and scope of the claims and equivalents.

REFERENCE SIGNS LIST

1 hard coating layer
2 inner layer (titanium carbonitride layer)
3 lower intermediate layer (titanium nitride layer)
4 upper intermediate layer (titanium carbonitride layer)
5 bonding auxiliary layer (titanium oxycarbonitride layer)
6 outer layer (α-aluminum oxide layer)
7 columnar grains
8 tool substrate

The invention claimed is:

1. A surface coated cutting tool comprising:
a tool substrate; and
a hard coating layer on the tool substrate; the hard coating layer comprising, in sequence from the tool substrate toward a surface of the tool,
an inner layer, a lower intermediate layer, an upper intermediate layer, a bonding auxiliary layer, and outer layer, wherein
the inner layer comprises titanium carbonitride and has an average thickness in the range of 4.0 to 20.0 μm,
the lower intermediate layer comprises titanium nitride and has an average thickness in the range of 0.1 to 2.0 μm,
the upper intermediate layer comprises titanium carbonitride and has an average thickness in the range of 0.1 to 2.5 μm,
titanium nitride grain boundaries in the lower intermediate layer and titanium carbonitride grain boundaries in the upper intermediate layer are continuous from titanium carbonitride grain boundaries in the inner layer,
the bonding auxiliary layer comprises titanium oxycarbonitride and has an average thickness in the range of 3 to 80 nm,
the outer layer comprises α-aluminum oxide and has an average thickness in the range of 2.0 to 20.0 μm,
the texture coefficient TC(422) of titanium carbonitride in the inner layer and the upper intermediate layer is 3.0 or more, and the texture coefficient TC (0 0 12) of α-aluminum oxide in the outer layer is 5.0 or more.

\* \* \* \* \*